US012610721B2

(12) United States Patent
Wang et al.

(10) Patent No.: US 12,610,721 B2
(45) Date of Patent: Apr. 21, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yanqiang Wang, Beijing (CN); Ruoxiang Li, Beijing (CN); Xiaoyi Wang, Beijing (CN); Pei Liu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 417 days.

(21) Appl. No.: 18/028,234

(22) PCT Filed: Feb. 25, 2022

(86) PCT No.: PCT/CN2022/078056

§ 371 (c)(1),
(2) Date: Mar. 24, 2023

(87) PCT Pub. No.: WO2023/159502

PCT Pub. Date: Aug. 31, 2023

(65) Prior Publication Data

US 2024/0357907 A1 Oct. 24, 2024

(51) Int. Cl.
*H10K 59/80* (2023.01)
*H10K 59/38* (2023.01)
(Continued)

(52) U.S. Cl.
CPC ........... *H10K 59/879* (2023.02); *H10K 59/38* (2023.02); *H10K 59/40* (2023.02);
(Continued)

(58) Field of Classification Search
CPC .................................................... H10K 59/879
See application file for complete search history.

(56) References Cited

U.S. PATENT DOCUMENTS

2019/0121176 A1* 4/2019 Lee ...................... H10K 59/879
2020/0388789 A1 12/2020 Cha et al.
(Continued)

FOREIGN PATENT DOCUMENTS

CN 111509140 A 8/2020
CN 113161504 A 7/2021
(Continued)

OTHER PUBLICATIONS

International Search Report and Written Opinion issued Nov. 1, 2022 in International Patent Application No. PCT/CN2022/078056 with English translation thereof, 8 pages.

*Primary Examiner* — Eva Y Montalvo
(74) *Attorney, Agent, or Firm* — XSENSUS LLP

(57) ABSTRACT

There is provided a display panel and a display device. The display panel includes a display substrate, a first light extraction layer and a second light extraction layer. The display substrate includes a plurality of sub-pixels. The first light extraction layer is arranged on a light exit side of the display substrate. The first light extraction layer includes a plurality of first grooves. An orthographic projection of each of the first grooves on the display substrate covers a corresponding sub-pixel. The second light extraction layer is arranged on a side of the first light extraction layer away from the display substrate and at least partially arranged in the first grooves. A refractive index of the second light extraction layer is greater than a refractive index of the first light extraction layer. The second light extraction layer includes a plurality of second grooves.

17 Claims, 8 Drawing Sheets

(51) Int. Cl.
    H10K 59/40         (2023.01)
    H10K 102/00      (2023.01)

(52) U.S. Cl.
    CPC ....... H10K 59/8722 (2023.02); H10K 59/873
        (2023.02); *H10K 2102/351* (2023.02)

(56)                References Cited

U.S. PATENT DOCUMENTS

2021/0408172 A1*  12/2021  Zhang ................ H10K 59/8731
2022/0006059 A1*   1/2022  Kim .................... H10K 50/844

FOREIGN PATENT DOCUMENTS

| CN | 113178529 | A | 7/2021 |
| CN | 113629214 | A | 11/2021 |
| CN | 114050224 | A | 2/2022 |
| KR | 100786469 | B1 | 12/2007 |
| KR | 20070117894 | A | 12/2007 |
| KR | 20200141553 | A | 12/2020 |

* cited by examiner

DISPLAY PANEL AND DISPLAY DEVICE

CROSS-REFERENCE TO RELATED APPLICATION

The present application is based on PCT filing PCT/CN2022/078056, filed Feb. 25, 2022, the entire contents of which are incorporated herein by reference.

TECHNICAL FIELD

The present disclosure relates to the display technical field, and in particular, to a display panel and a display device.

BACKGROUND

With the advancements of technologies and improvements of social living standards, consumers have increasingly higher requirements for display products. For display manufacturers, the production of high-resolution and high-quality display products is a definite development direction.

However, the light extraction efficiency of current display products is relatively low.

It should be noted that the information disclosed in the background section above is only used to enhance the understanding of the background of the present disclosure, and therefore may include information that does not constitute the prior art known to those skilled in the art.

SUMMARY

The present disclosure aims at providing a display panel and a display device to overcome the shortcomings in the above-mentioned related arts.

According to an aspect of the present disclosure, there is provided a display panel, including:

a display substrate including a plurality of sub-pixels;

a first light extraction layer arranged on a light exit side of the display substrate, wherein the first light extraction layer includes a plurality of first grooves, and an orthographic projections of each of the first grooves on the display substrate covers a corresponding sub-pixel; and a second light extraction layer arranged on a side of the first light extraction layer away from the display substrate and at least partially arranged in the first grooves, wherein a refractive index of the second light extraction layer is greater than a refractive index of the first light extraction layer, the second light extraction layer includes a plurality of second grooves, and an orthographic projection of each of the second grooves on the display substrate covers a corresponding sub-pixel.

In an example embodiment of the present disclosure, a height of a groove sidewall of each of the first grooves in a second direction increases as a distance from a center of the corresponding sub-pixel in a first direction increases, a height of a groove sidewall of each of the second grooves in the second direction increases as a distance from the center of the corresponding sub-pixel in the first direction increases, the second direction is perpendicular to a display surface of the display substrate, and the first direction is parallel to the display surface of the display substrate.

In an example embodiment of the present disclosure, the groove sidewall of each of the first grooves includes a curved surface, the groove sidewall of each of the second grooves includes a curved surface, and a radius of curvature of the groove sidewall of each of the first grooves is smaller than a radius of curvature of the groove sidewall of each of the second grooves.

In an example embodiment of the present disclosure, the groove sidewall of each of the first grooves includes a first portion and a second portion that are smoothly connected in sequence, the first portion is closer to the display substrate than the second portion, the first portion is set as a slope, and the second portion is set as an arc surface; and the groove sidewall of each of the second groove includes a third portion, a fourth portion and a fifth portion that are smoothly connected in sequence, the third portion is closer to the display substrate than the fifth portion, the fourth portion is set as a slope, and the third portion and the fifth portion are set as arc surfaces.

In an example embodiment of the present disclosure, an inclination angle of the first portion is greater than an inclination angle of the fourth portion.

In an example embodiment of the present disclosure, the groove sidewall of each of the first grooves is set as a slope, the groove sidewall of each of the second grooves is set as a slope, and an inclination angle of the groove sidewall of each of the first grooves is greater than an inclination angle of the groove sidewall of each of the second grooves.

In an example embodiment of the present disclosure, the orthographic projection of each of the first grooves on the display substrate is located within an orthographic projection of a corresponding one of the second grooves on the display substrate.

In an example embodiment of the present disclosure, an orthographic projection of the groove sidewall of each of the first grooves on the display substrate is located within an orthographic projection of a groove sidewall of the corresponding one of the second grooves on the display substrate.

In an example embodiment of the present disclosure, a groove bottom wall of each of the first grooves is a flat surface, a groove bottom wall of each of the second grooves is a flat surface, an orthographic projection of the groove bottom wall of each of the second grooves on the display substrate covers a corresponding sub-pixel, and the orthographic projection of the groove bottom wall of each of the second grooves on the display substrate is located within an orthographic projection of the groove bottom wall of a corresponding one of the first grooves on the display substrate.

In an example embodiment of the present disclosure, the orthographic projection of each of the second grooves on the display substrate is located within an orthographic projection of a corresponding one of the first grooves on the display substrate.

In an example embodiment of the present disclosure, a groove bottom wall of each of the first grooves is a flat surface, a groove bottom wall of each of the second grooves is a flat surface, an orthographic projection of the groove bottom wall of each of the second grooves on the display substrate covers a corresponding sub-pixel, and the orthographic projection of each of the second grooves on the display substrate is located within an orthographic projection of the groove bottom wall of a corresponding one of the first grooves on the display substrate.

In an example embodiment of the present disclosure, a depth of each of the first grooves is greater than a depth of each of the second grooves.

In an example embodiment of the present disclosure, a distance between a plane where a groove bottom wall of each of the second grooves is located and the display substrate is greater than a distance between the display substrate and a surface of the first light extraction layer away from the display substrate.

In an example embodiment of the present disclosure, each of the first grooves is set as a via hole penetrating the first light extraction layer.

In an example embodiment of the present disclosure, the display panel further includes:

an encapsulation layer group arranged on the light exit side of the display substrate.

In an example embodiment of the present disclosure, the display panels further includes:

a touch layer group arranged on a side of the encapsulation layer group away from the display substrate; wherein the touch layer group includes:

a first touch metal layer arranged on the light exit side of the display substrate;

a touch insulating layer arranged on a side of the first touch metal layer away from the display substrate, wherein the touch insulating layer is reused as the first light extraction layer; and a second touch metal layer arranged on a side of the touch insulating layer away from the display substrate.

In an example embodiment of the present disclosure, the touch layer group further includes:

a protection layer arranged on a side of the second touch metal layer away from the display substrate, wherein the protection layer is reused as the second light extraction layer.

In an example embodiment of the present disclosure, the first touch metal layer and the second touch metal layer form a touch pattern, and the touch pattern includes a plurality of metal lines, a gap is provided between two adjacent second grooves, and an orthographic projection of each of the metal lines on the display substrate is located within an orthographic projection of a corresponding gap on the display substrate.

In an example embodiment of the present disclosure, the display panel further includes:

a color filter layer arranged on a side of the encapsulation layer group away from the display substrate, wherein the color filter layer includes a black matrix and a filter portion.

In an example embodiment of the present disclosure, an edge portion of the black matrix covers an edge portion of the filter portion, and a height of the black matrix in the second direction is greater than a height of the filter portion in the second direction, and the black matrix is reused as the first light extraction layer.

In an example embodiment of the present disclosure, a height of the black matrix in the second direction is smaller than a height of the filter portion in the second direction, and the first light extraction layer is arranged on a side of the color filter layer away from the display substrate.

In an example embodiment of the present disclosure, the encapsulation layer group includes:

an encapsulation base layer arranged on the light exit side of the display substrate;

a first encapsulation layer arranged on a side of the encapsulation base layer away from the display substrate;

a second encapsulation layer arranged on a side of the first encapsulation layer away from the display substrate; and a third encapsulation layer arranged on a side of the second encapsulation layer away from the display substrate;

wherein the first light extraction layer is a layer in the encapsulation layer group, and the second light extraction layer is a layer in the encapsulation layer group.

In an example embodiment of the present disclosure, the first encapsulation layer is reused as the first light extraction layer, the second encapsulation layer is reused as the second light extraction layer, and a part of the third encapsulation layer is arranged in the second grooves.

In an example embodiment of the present disclosure, the display panel further includes:

a third light extraction layer arranged on a side of the second light extraction layer away from the display substrate and partially arranged in the second grooves, wherein a refractive index of the third light extraction layer is larger than or smaller than the refractive index of the second light extraction layer.

In an example embodiment of the present disclosure, the display panel further includes:

an adhesive layer arranged on the light exit side of the display substrate; and a cover plate arranged on a side of the adhesive layer away from the display substrate.

In an example embodiment of the present disclosure, the side of the adhesive layer away from the display substrate is a flat surface.

In an example embodiment of the present disclosure, the adhesive layer is arranged on the side of the second light extraction layer away from the display substrate, and the adhesive layer is reused as the third light exit layer.

According to another aspect of the present disclosure, there is provided a display device, including the display panel according to any one of the above embodiments.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

EXPLANATION OF REFERENCE SIGNS

Figure 1:
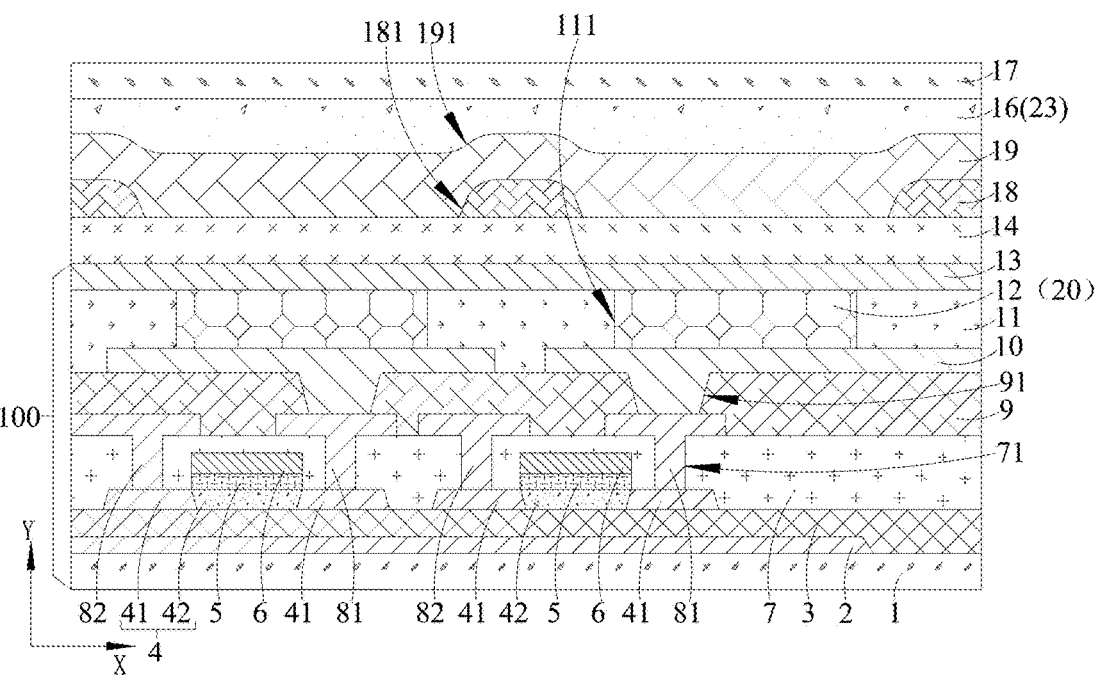
FIG. 1 is a schematic structural diagram of a display panel according to a first example embodiment of the present disclosure.

1: base substrate; 2: light shielding layer; 3: buffer layer; 4: active layer; 41: conductor portion; 42: channel portion;
5: gate insulating layer; 6: gate;
7: interlayer dielectric layer; 71: first via hole;
81: source; 82: drain;
9: planarization layer; 91: second via hole;
10: first electrode;
11: pixel-defining layer; 111: third via hole;
12: light-emitting layer group; 13: second electrode;
14: encapsulation layer group; 140: encapsulation base layer; 141: first encapsulation layer; 142: second encapsulation layer; 143: third encapsulation layer;
15: touch layer group; 151: first touch metal layer; 152: touch insulating layer; 153: second touch metal layer; 154: protection layer;
16: adhesive layer; 17: cover plate;
18: first light extraction layer; 181: first groove; 1811: first inner ring line; 1812: first outer ring line; 1813: first portion; 1814: second portion; 182: first light extraction material layer;
19: second light extraction layer; 191: second groove; 1911: second inner ring line; 1912: second outer ring line; 1913: third portion; 1914: fourth portion; 1915: fifth portion;
20: sub-pixel; 21: photoresist;
22: mask plate; 221: light shielding portion; 222: light transmission portion;
23: The third light extraction layer;
24: color filter layer; 241: filter portion; 242: black matrix;
X: first direction; Y: second direction; 100: display substrate.

DETAILED DESCRIPTION

Example embodiments will now be described more fully with reference to the accompanying drawings. However, the example embodiments can be implemented in various forms and should not be construed as limited to the examples set forth herein; rather, providing these embodiments makes the present disclosure more comprehensive and complete, and conveys the concepts of the example embodiments comprehensively to those skilled in the art. The same reference numerals in the drawings denote the same or similar structures, and thus their repeated descriptions will be omitted. Furthermore, the drawings are merely schematic illustrations of the present disclosure and are not necessarily drawn to scale.

Although relative terms such as "upper" and "lower" are used in the specification to describe a relative relationship of one component shown in the drawings to another component, these terms are used in the specification only for convenience, and are for example based on the direction(s) as illustrated in the drawings. It will be appreciated that if the illustrated device is turned over so that it is upside down, then a component described as being "upper" will become an element that is "lower". When a structure is "on" another structure, it may mean that the structure is integrally formed on another structure, or that the structure is "directly" placed on another structure, or that the structure is "indirectly" placed on another structure through other structure(s).

The terms "a", "an", "the", "said" and "at least one" are used to indicate the presence of one or more elements/components/etc. The terms "includes/include" and "have/has" are used to indicate open-ended inclusion and to mean that additional elements/components/etc. may exist in addition to the listed elements/components/etc. The terms "first", "second" and "third" are used as markers only and are not quantitative restrictions on their associated objects.

An example embodiment of the present disclosure provides a display panel. As shown in FIG. 1 to FIG. 5, the display panel may include a display substrate 100, a first light extraction layer 18 and a second light extraction layer 19. The display substrate 100 may include a plurality of sub-pixels 20. The first light extraction layer 18 is arranged on a light exit side of the display substrate 100. The first light extraction layer 18 may include a plurality of first grooves 181, and an orthographic projection of each of the first grooves 181 on the display substrate covers a corresponding sub-pixel 20. The second light extraction layer 18 is arranged on a side of the first light extraction layer 18 away from the display substrate 100 and at least partially arranged in the first grooves 181. A refractive index of the second light extraction layer 19 is greater than a refractive index of the first light extraction layer 18. The second light extraction layer 19 may include plurality of second grooves 191, and an orthographic projection of each of the second grooves 191 on the display substrate 100 covers a corresponding sub-pixel 20.

In the display panel and display device according to embodiments of the present disclosure, an interface between the second light extraction layer 19 and the groove sidewall of each of the first grooves 181 is a total reflection surface, and the groove sidewall of each of the first grooves 181 causes total reflection of inclined emitted light to form total reflected light, changing the angle of the emitted light, so that the total reflected light is more converged and emitted from the front side of the display panel, thereby improving the light extraction efficiency of the front side of the display panel. Therefore, under the same brightness requirement, the power consumption of the display panel can be reduced. The lateral light extraction efficiency of the display panel can be reduced, thus improving the privacy protection effect. The groove sidewall of each of the second grooves 191 forms a refraction surface, and the total reflected light forms refracted light after being refracted by the refraction surface, thus changing the angle of the total reflected light, so that the refracted light can be emitted substantially perpendicular to the display surface of the display substrate 100. This can further improve the light extraction efficiency of the front side of the display panel. Therefore, under the same brightness requirement, the power consumption of the display panel can be further reduced. The lateral light extraction efficiency of the display panel can be reduced, thus improving the privacy protection effect. In addition, cross-color can be reduced, thus improving display effect.

The display substrate 100 may be an Organic Electroluminescence Display (OLED) display substrate, a Quantum Dot Light-emitting Diodes (QLED) display substrate, and so on. The display substrate 100 has a light exit side and a non-light exit side. The light exit side and the non-light exit side is oppositely arranged. Images can be displayed at the light exit side, and a surface for displaying images is a display surface. The OLED display substrate 100 has the characteristics of self-illumination, high brightness, wide viewing angle, fast response time, and characteristic that R, G, and B full-color components can be manufactured, and thus it is regarded as a star product of the next-generation display.

The OLED is taken as an example for description below.

The display substrate 100 may include a driving backplane and light-emitting devices. The driving backplane may include at least one driving circuit, and the driving circuit may drive the light-emitting devices to emit light.

In an example embodiment, the driving backplane may include a base substrate 1. The material of the base substrate 1 may include an inorganic material. For example, the inorganic material may be glass, quartz, or metal and so on. The material of the base substrate 1 may also include an organic material. For example, the organic material may be a resin material such as polyimide, polycarbonate, polyacrylate, polyetherimide, polyethersulfone, polyethylene terephthalate, and polyethylene naphthalate. The base substrate 1 may be formed of multiple material layers. For example, the base substrate 1 may include multiple base layers, and the material of the base layers may be any one of the above-mentioned materials. Alternatively, the base substrate 1 may be set as a single layer, which may be any one of the above materials.

A light shielding layer 2 may also be formed on a side of the base substrate 1. The light incident from the base substrate 1 into an active layer 4 will generate photocarriers in the active layer 4, thereby having a huge impact on the characteristics of the thin film transistors, and finally, the display quality of the display device may be affected. The light incident from the base substrate 1 can be shielded by the light shielding layer 2, so as to avoid affecting the characteristics of the thin film transistors and the display quality of the display device.

A buffer layer 3 may also be formed on a side of the light shielding layer 2 away from the base substrate 1. The buffer layer 3 plays the role of blocking water vapor and impurity ions in the base substrate 1 (especially organic materials), and plays the role of increasing hydrogen ions for the subsequent formation of the active layer 4. The material of the buffer layer 3 is an insulating material, which can insulate the light shielding layer 2 from the active layer 4.

The active layer 4 is arranged on a side of the buffer layer 3 away from the base substrate 1. The active layer 4 may include a channel portion 42 and conductor portions 41 arranged at both ends of the channel portion 42. A gate insulating layer 5 is arranged on a side of the active layer 4 away from the base substrate 1. A gate 6 is arranged on a side of the gate insulating layer 5. An interlayer dielectric layer 7 is arranged on a side of the gate 6 away from the base substrate 1. First via holes 71 are arranged in the interlayer dielectric layer 7, and the first via hole 71 are connected to the conductor portions 41. A source 81 and a drain 82 are arranged on a side of the interlayer dielectric layer 7 away from the base substrate 1. The source 81 and the drain 82 are respectively connected to the two conductor portions 41 through the two first via holes 71. A planarization layer 9 is arranged on a side of the source 81 and the drain 82 away from the base substrate 1, and a second via hole 91 is arranged in the planarization layer 9. The second via hole 91 is connected to the source 81. The active layer 4, the gate 6, the source 81 and the drain 82 form a thin film transistor.

It should be noted that the thin film transistor described in the specification is a top-gate thin film transistor. In other example embodiments of the present disclosure, the thin film transistor may also be a bottom-gate or double-gate type, and the specific structure thereof will not be described here. Furthermore, when using a thin film transistor with an opposite polarity or when the direction of current changes during circuit operation, the functions of the "source 81" and "drain 82" may be interchanged. Therefore, in this specification, "source 81" and "drain 82" can be interchanged with each other.

At least one light-emitting device is arranged on a side of the planarization layer 9 away from the base substrate 1. The light-emitting device may include a first electrode 10, a pixel-defining layer 11, a light-emitting layer group 12 and a second electrode 13.

Specifically, the first electrode 10 is arranged on a side of the planarization layer 9 away from the base substrate 1. The first electrode 10 is connected to the source 81 of the driving backplane through the second via hole 91, and the first electrode 10 may be an anode.

The pixel-defining layer 11 is arranged on a side of the first electrode 10 away from the base substrate 1. A third via hole 111 is arranged in the pixel-defining layer 11, and a light-emitting layer group 12 is arranged in the third via hole 111. The second electrode 13 is arranged on a side of the light-emitting layer group 12 away from the base substrate 1. The second electrode 13 may be a cathode, and the second electrode 13 is connected to a ground line VSS. The light-emitting layer group 12 in a third via hole 111 emits light to form a sub-pixel 20. Therefore, the light-emitting layer group 12 in a third via hole 111 is a sub-pixel 20. The orthographic projection of the sub-pixel 20 on the display substrate 100 is the orthographic projection of the light-emitting layer group 12 on the display substrate 100. The display substrate 100 may include a plurality of sub-pixels 20.

The light-emitting layer group 12 may include a hole injection layer, a hole transport layer, a light-emitting layer, an electron transport layer, and an electron injection layer stacked in sequence. The hole injection layer is in contact with the first electrode 10, and the electron injection layer is in contact with the second electrode 13. Alternatively, in some other example embodiments of the present disclosure, the light-emitting layer group 12 may only include a hole transport layer, a light-emitting layer and an electron transport layer, and the light-emitting layer group 12 may also have other structures, and its specific structure may be set as required.

The first light extraction layer 18 may include a plurality of first grooves 181. Each first groove 181 may include a groove sidewall and a groove bottom wall. The groove bottom wall is parallel to the display surface. The groove sidewall intersects the display surface. There is a one-to-one correspondence between the first grooves 181 and the sub-pixels 20. Specifically, the number of the first grooves 181 is the same as the number of the sub-pixels 20, and the shape of the first grooves 181 is the same as the shape of the sub-pixels 20. For example, the sub-pixels 20 are set as circle, and the first grooves 181 are also set as circle. Alternatively, the sub-pixels 20 are set as rectangle, and the first grooves 181 are also set as a rectangle. Alternatively, in some other example embodiments of the present disclosure, the shape of the sub-pixels 20 and the shape of the first grooves 181 may also be other shapes, which will not be described here.

Figure 2:
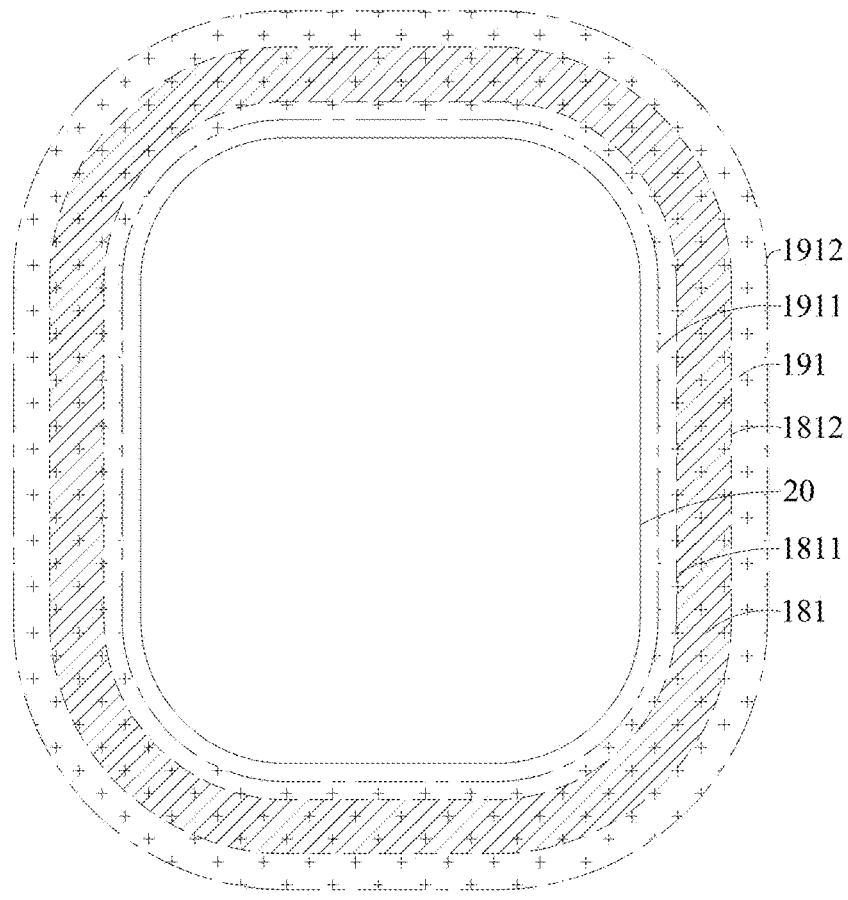
FIG. 2 is a schematic top view of first grooves, second grooves and sub-pixels in FIG. 1.

Referring to FIG. 2, the orthographic projection of each first groove 181 on the display substrate 100 covers a corresponding sub-pixel 20. That is, the edge of the orthographic projection of the first groove 181 on the display substrate 100 may coincide with the edge of the sub-pixel 20. Alternatively, it may be that the sub-pixel 20 is in the orthographic projection of the first groove 181 on the display substrate 100.

It should be noted that, since the groove sidewall of the first groove 181 is inclined and the sub-pixel 20 is arranged as planar, when compared with the sub-pixel 20, the range of the orthographic projection of the first groove 181 on the display substrate 100 refers to: the orthographic projection of the surface (groove bottom wall) of the first groove 181 close to the display substrate 100 on the display substrate 100. That is, the orthographic projection of the groove bottom wall of the first groove 181 on the display substrate 100 covers the sub-pixel 20. Similarly, when compared with the sub-pixel 20, the range of the orthographic projection of the second groove 191 on the display substrate 100 refers to: the orthographic projection of the surface (groove bottom wall) of the second groove 191 close to the display substrate 100 on the display substrate 100. That is, the orthographic projection of the groove bottom wall of the second groove 191 on the display substrate 100 covers the sub-pixel 20.

Figure 3:
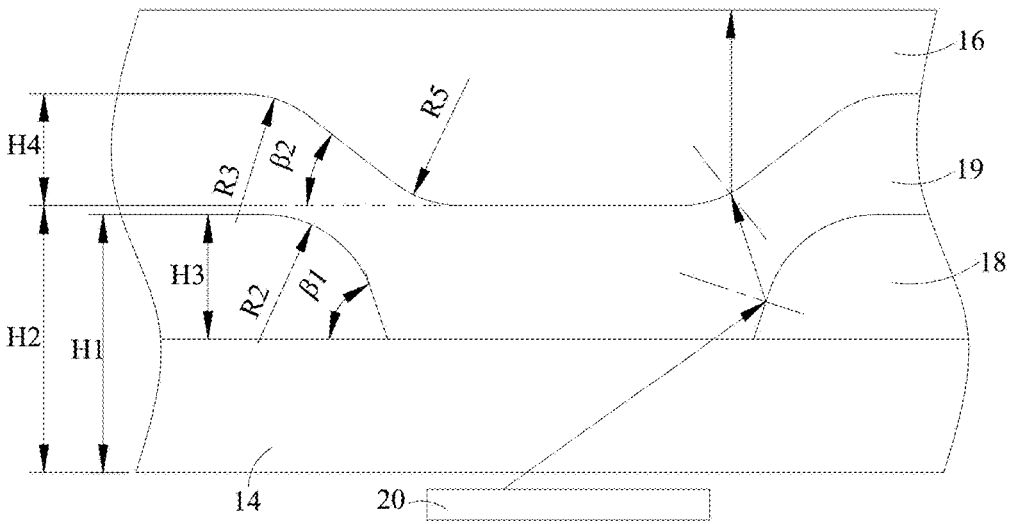
FIG. 3 is a schematic diagram of an optical path of the display panel in FIG. 1.

Referring to FIG. 3, the second light extraction layer 19 is arranged on a side of the first light extraction layer 18 away from the display substrate 100, and at least part of the second light extraction layer 19 is arranged in the first grooves 181. The refractive index of the layer 19 is greater than the refractive index of the first light extraction layer 18. Therefore, total reflection easily occurs at the interface between the second light extraction layer 19 and the groove sidewalls of the first grooves 181. The groove sidewalls of the first grooves will cause total reflection of the inclined emitted light to form total reflected light, changing the angle of the emitted light, so that the total reflected light is more convergent, and it is emitted from the front side of the display panel. This can improve the light extraction efficiency of the front side of the display panel and reduce the lateral light extraction efficiency of the display panel, and improve the privacy protection effect.

The second light extraction layer 19 may include a plurality of second grooves 191. Each second grooves 191 may include a groove sidewall and a groove bottom wall. The groove bottom wall is parallel to the display surface, and the groove sidewall intersects the display surface. The second grooves 191 are in one-to-one correspondence with the first grooves 181. The number of the first grooves 181 is the same as the number of the second grooves 191, and the shape of the first grooves 181 is the same as that of the second grooves 191. For example, the first grooves 181 are set as circle, and the second grooves 191 are set as circle. Alternatively, the first grooves 181 are set as a rectangle, and the second grooves 191 are also set as rectangle. Alternatively, in some other example embodiments of the present disclosure, the shape of the second grooves 191 and the shape of the first grooves 181 can also be other shapes, which will not be described here.

Referring to FIG. 2, the orthographic projection of each first groove 181 on the display substrate 100 is located within the orthographic projection of a corresponding second groove 191 on the display substrate 100. The orthographic projection of the first groove 181 on the display substrate 100 may coincide with the orthographic projection of the second groove 191 on the display substrate 100. Alternatively, the orthographic projection of the first groove 181 on the display substrate 100 may be located within the orthographic projection of the second groove 191 on the display substrate 100.

It should be noted that, since the groove sidewall of the first groove 181 is inclined and the groove sidewall of the second groove 191 is inclined, when the first groove 181 and the second groove 191 are compared, the range of the orthographic projection of the groove 181 on the display substrate 100 refers to: the orthographic projection of the surface of the first groove 181 away from the display substrate 100 (the opening of the first groove 181) on the display substrate 100, and the range of the orthographic projection of the second groove 191 on the display substrate 100 refers to: the orthographic projection of the side of the second groove 191 away from the display substrate 100 (the opening of the second groove 191) on the display substrate 100.

In addition, the groove bottom wall of the first groove 181 is a flat surface, and the groove bottom wall of the second groove 191 is a flat surface. The orthographic projection of the groove bottom wall of the second groove 191 on the display substrate 100 covers the sub-pixel 20. The orthographic projection of the groove bottom wall of the second groove 191 on the display substrate 100 is located within the orthographic projection of the groove bottom wall of the first groove 181 on the display substrate 100. That is, the sub-pixel 20, the first groove 181 and the second groove 191 are arranged oppositely, the area of the groove bottom wall of the second groove 191 is less than or equal to the area of the groove bottom wall of the first groove 181, and the area of the sub-pixel 20 is less than or equal to the groove bottom wall of the second groove 191. By such arrangement, the emitted light perpendicular to the display surface emitted from the sub-pixel 20 will not be totally reflected by the groove sidewall of the first groove 181, and will not be refracted by the groove sidewall of the second groove 191, and thus the overall display effect of the display panel is not influenced.

Referring to FIG. 3, the groove sidewall of the second groove 191 forms a refraction surface, the total reflected light is refracted by the refraction surface to form refracted light, and the angle of the total reflected light is changed, so that the refracted light is substantially perpendicular to the surface of the display substrate 100. This can further increase the light extraction efficiency of the front side of the display panel, and reduce the lateral light extraction efficiency of the display panel, and accordingly improve the privacy protection effect. Moreover, cross-color can be reduced, thereby improving the display effect.

The height of the groove sidewall of the first groove 181 in a second direction Y increases as the distance from the center of the sub-pixel 20 in a first direction X increases, and the height of the groove sidewall of the second groove 191 in the second direction Y increases as the distance from the center of the sub-pixel 20 in the first direction X increases. The second direction Y is perpendicular to the display surface of the display substrate 100. The first direction X is parallel to the display surface of the display substrate 100.

Figure 10:
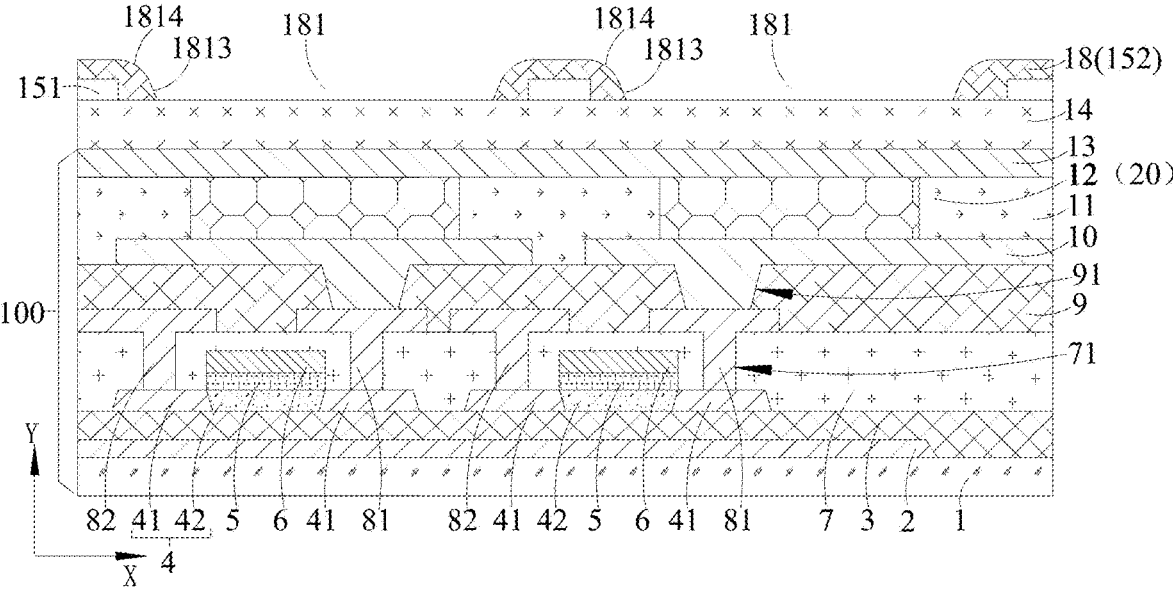

Referring to FIG. 1, FIG. 3 and FIG. 10, in some example embodiments of the present disclosure, the groove sidewall of the first groove 181 may include a curved surface, and the curved surface may be set as a protrusion. The groove sidewall of the first groove 181 may include a first portion 1813 and a second portion 1814 connected smoothly in sequence. The first portion 1813 is closer to the display substrate than the second portion 1814. The first portion 1813 is set as a slope, and the second portion 1814 is set as an arc surface. A part of the groove sidewall of the first groove 181 close to the display substrate 100 may be slope, and a part of the groove sidewall of the first groove 181 away from the display substrate 100 may be an arc surface.

Figure 12:
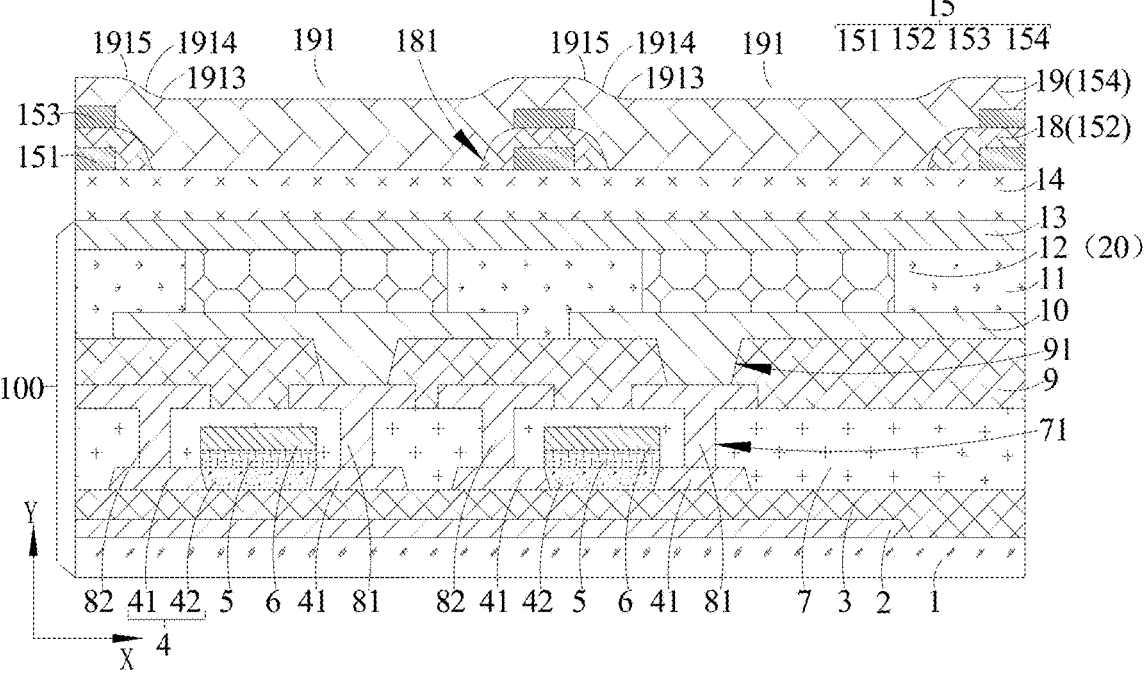

Referring to FIG. 1, FIG. 3 and FIG. 12, the groove sidewall of the second groove 191 may also include a curved surface. Specifically, a part of the groove sidewall of the second groove 191 close to the display substrate 100 may be an arc surface, and the arc surface may be set as a concave shape. A part of the groove sidewall of the second groove 191 away from the display substrate 100 may be an arc surface, and the arc surface may be set in a protruding shape. The two arc surfaces may be directly smoothly connected. For example, two arc surfaces may be directly connected tangentially. There may also be a slope connected between the two arc surfaces, and the two arc surfaces may be smoothly connected with the slope. That is, the groove sidewall of the second groove 191 may include a third portion 1913, a fourth portion 1914, and a fifth portion 1915 that are smoothly connected in sequence. The third portion 1913 is closer to the display substrate than the fifth portion 1915. The fourth portion 1914 is set as a slope. The third portion 1913 and the fifth portion 1915 are set as arc surfaces. Referring to FIG. 3, the radius of curvature R3 of the third portion 1913 and the radius of curvature R5 of the fifth portion 1915 are greater than the radius of curvature R2 of the second portion 1814, so that the radius of curvature of the groove sidewall of the first groove 181 is smaller than the radius of curvature of the groove sidewall of the second groove 191.

Referring to FIG. 3, the inclination angle β1 of the first portion 1813 is greater than the inclination angle β2 of the fourth portion 1914, so that the inclination angle of the groove sidewall of the first groove 181 is greater than the inclination angle of the groove sidewall of the second groove 191.

It should be noted that, the above inclination angles all refer to included angles with a plane parallel to the display substrate 100.

Since the second light extraction layer 19 is formed after the first light extraction layer 18, the second light extraction layer 19 has a certain planarization effect on the first light extraction layer 18. Therefore, the radius of curvature of the groove sidewall of the first groove 181 is smaller than the radius of curvature of the groove sidewall of the second groove 191. That is, the groove sidewall of the second groove 191 is gentler, and the groove sidewall of the first groove 181 is steeper. The above arc curved surfaces may also be elliptical arc curved surfaces, parabolic curved surfaces and the like. Of course, in some other example embodiments of the present disclosure, the groove sidewall of the first groove 181 may also be formed by circular arc surface, elliptical arc surface, parabolic curved surface and the like.

Figure 4:
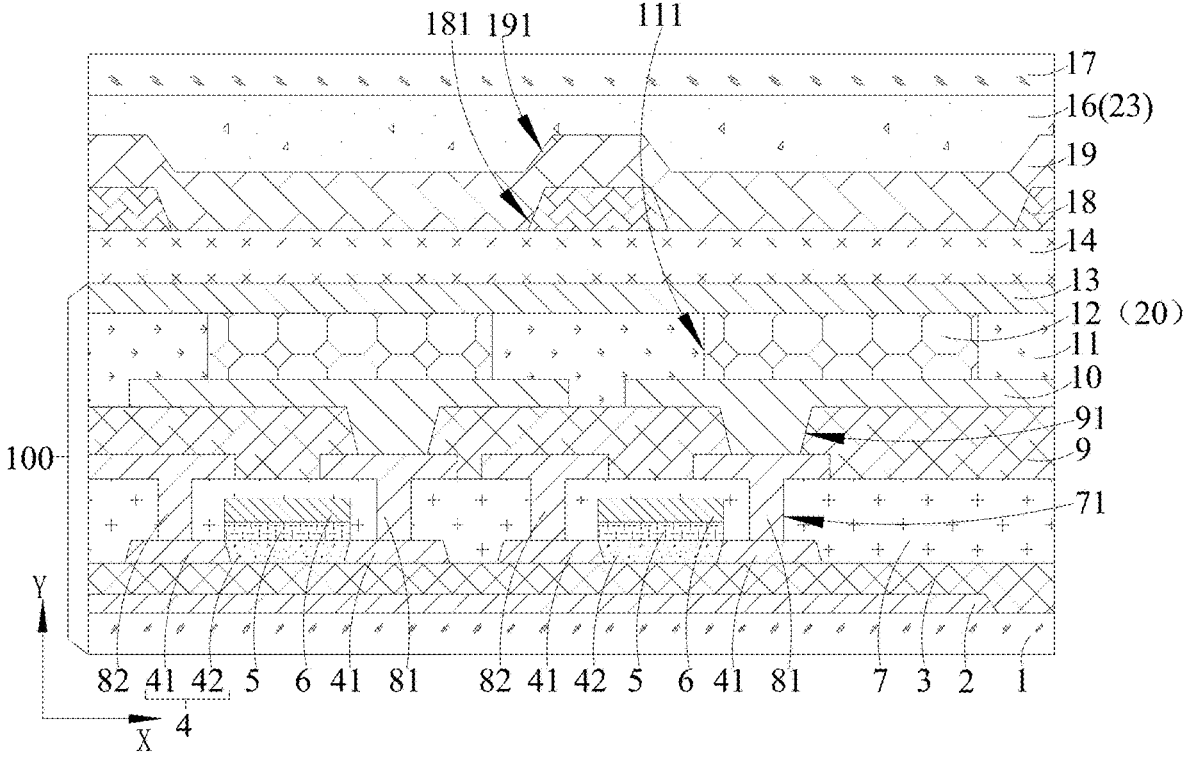
FIG. 4 is a schematic structural diagram of a display panel according to a second example embodiment of the present disclosure.
Figure 5:
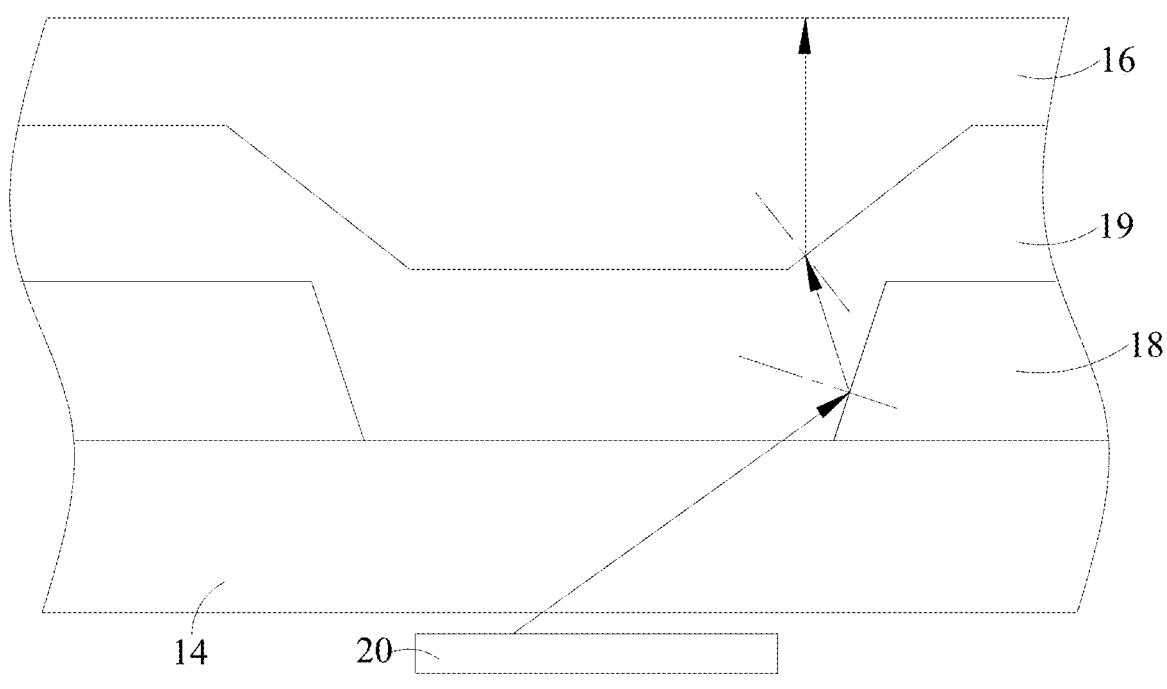
FIG. 5 is a schematic diagram of an optical path of the display panel in FIG. 2.

Referring to FIG. 4 and FIG. 5, in some other example embodiments of the present disclosure, due to different manufacturing processes, the groove sidewall of the first groove 181 may be set as a slope, and the groove sidewall of the second groove 191 may be set as a slope. Because the second light extraction layer 19 is formed after the first light extraction layer 18, the second light extraction layer 19 has a certain planarization effect on the first light extraction layer 18. Therefore, the inclination angle of the groove sidewall of the first groove 181 is larger than the inclination angle of the groove sidewall of the second groove 191.

Referring to FIG. 2, the orthographic projection of the groove sidewall of the first groove 181 on the display substrate 100 is annular, and the orthographic projection of the groove sidewall of the first groove 181 on the display substrate 100 has a first inner ring line 1811 and a first outer ring line 1812. The orthographic projection of the groove sidewall of the second groove 191 on the display substrate 100 is annular, and the orthographic projection of the groove sidewall of the second groove 191 on the display substrate 100 has a second inner ring line 1911 and a second outer ring line 1912. The orthographic projection of the groove sidewall of the first groove 181 on the display substrate 100 is located in the orthographic projection of the groove sidewall of the second groove 191 on the display substrate 100. That is, the orthographic projection of the groove sidewall of the first groove 181 on the display substrate 100 may coincide with the orthographic projection of the groove sidewall of the second groove 191 on the display substrate 100. That is, the first inner ring line 1811 coincides with the second inner ring line 1911, and the first outer ring line 1812 coincides with the second outer ring line 1912; or, the edge of the orthographic projection of the groove sidewall of the first groove 181 on the display substrate 100 is located within the edge of the orthographic projection of the second groove 191 on the display substrate 100. That is, the first inner ring line 1811 and the first outer ring line 1812 are located between the second inner ring line 1911 and the second outer ring line 1912. Such an arrangement can ensure that the total reflected light emitted from the groove sidewall of the first groove 181 can almost completely be incident to the groove sidewall of the second groove 191 and can be refracted on the groove sidewall of the second groove 191.

Figure 6:
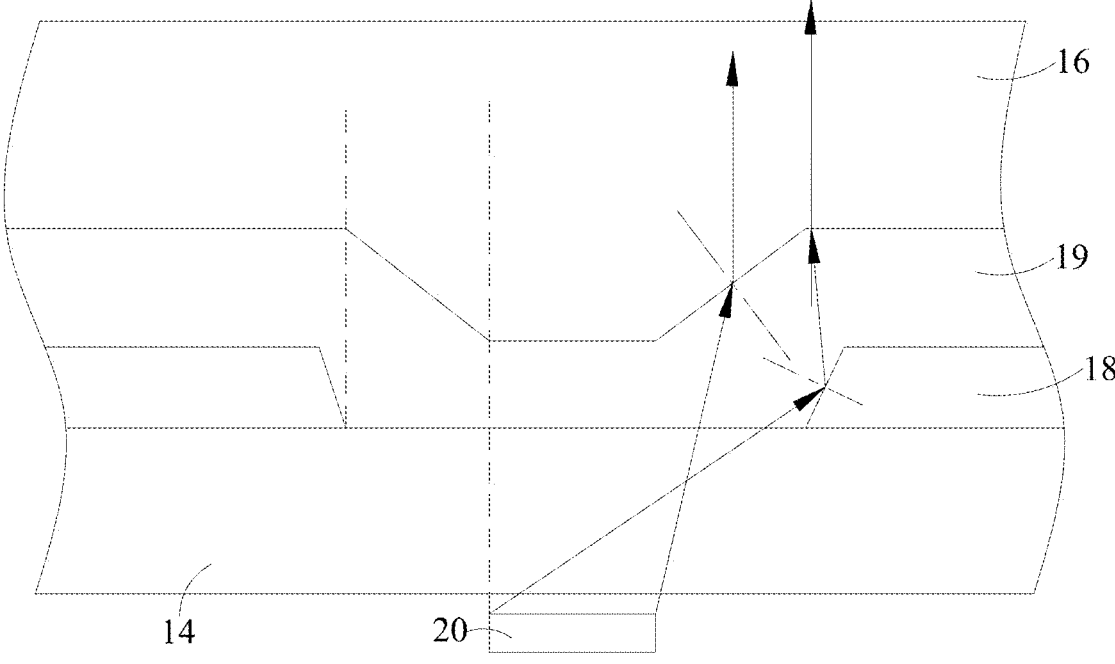
FIG. 6 is a schematic structural diagram of a display panel according to a third example embodiment of the present disclosure.
Figure 7:
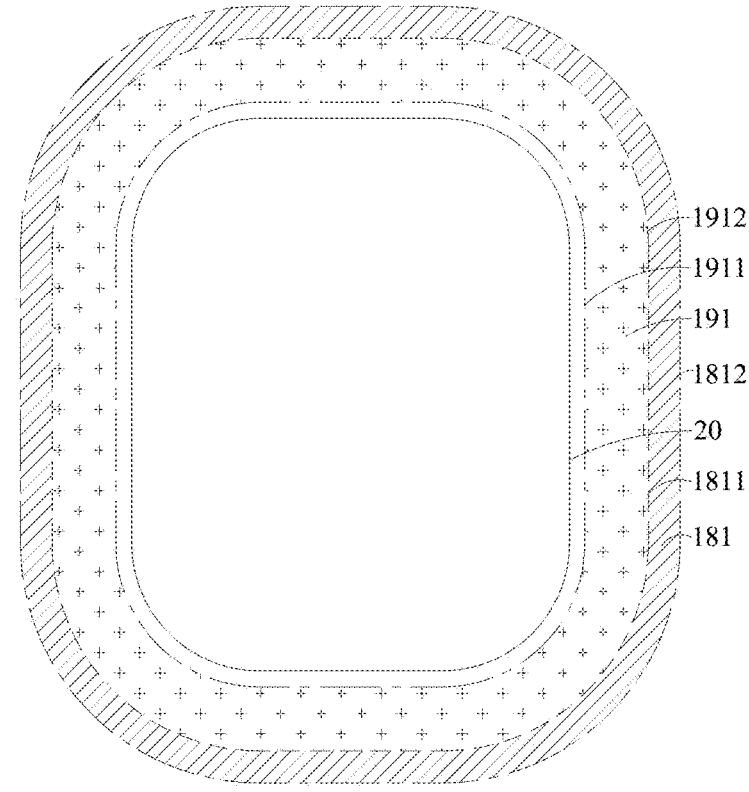
FIG. 7 is a schematic top view of first grooves, second grooves and sub-pixels in another embodiment.

In addition, in another example embodiment of the present disclosure, referring to FIG. 6 and FIG. 7, the orthographic projection of the second groove 191 on the display substrate 100 may be located within the orthographic projection of the first groove 181 on the display substrate 100. The shapes of the first groove 181 and the second groove 191 have been described in detail above, and thus details will not be repeated here.

Specifically, as shown in FIG. 6 and FIG. 7, the groove bottom wall of the first groove 181 is a flat surface, and the groove bottom wall of the second groove 191 is a flat surface. The orthographic projection of the groove bottom wall of the second groove 191 on the display substrate 100 covers the sub-pixel 20. That is, the area of the sub-pixel 20 is smaller than or equal to the area of the groove bottom wall of the second groove 191.

The orthographic projection of the groove sidewall of the first groove 181 on the display substrate 100 is annular, and the orthographic projection of the groove sidewall of the first groove 181 on the display substrate 100 has a first inner ring line 1811 and a first outer ring line 1812 The orthographic projection of the groove sidewall of the second groove 191 on the display substrate 100 is annular, and the orthographic projection of the groove sidewall of the second groove 191 on the display substrate 100 has a second inner ring line 1911 and a second outer ring line 1912. The orthographic projection of the second groove 191 on the display substrate 100 is located in the orthographic projection of the groove bottom wall of the first groove 181 on the display substrate 100. Referring to FIG. 7, it may be that the second outer ring line 1912 coincides with the first inner ring line 1811, or the second outer ring line 1912 is within the first inner ring line 1811. Of course, it is also possible that the second outer ring line 1912 coincides with the first outer ring line 1812, or the second outer ring line 1912 is located between the first inner ring line 1811 and the first outer ring line 1812; and the second inner ring line 1911 is located within the first inner ring line 1811.

The preparation process of the above-mentioned second groove 191 may be: firstly forming the second light extraction layer 19, and then forming the required second groove 191 in the second light extraction layer 19 by etching.

In an example embodiment, as shown in FIG. 3, the depth H3 of the first groove 181 is greater than the depth H4 of the second groove 191. That is, the depth H3 of the first groove 181 in the second direction Y is greater than the depth H4 of the second groove 191 in the second direction Y. Since the first light extraction layer 18 is first formed in the preparation process, and then the second light extraction layer 19 is formed, the second light extraction layer 19 has a certain planarization effect on the first light extraction layer 18, and thus the depth of the second groove 191 formed in the extraction layer 19 is smaller than the depth of the first groove 181 formed in the first light extraction layer 18.

The distance H2 between the plane where the groove bottom wall of the second groove 191 is located and the display substrate 100 is greater than the distance H1 between the display substrate 100 and a surface of the first light extraction layer 18 away from the display substrate 100. That is, the height H2 of the groove bottom wall of the second groove 191 in the second direction Y may be higher than the height H1 of the surface of the first light extraction layer 18 away from the display substrate 100 in the second direction Y.

Of course, in some other example embodiments of the present disclosure, the depth of the first groove 181 may be equal to or less than the depth of the second groove 191; the height of the groove bottom wall of the second groove 191 in the second direction Y may be equal to or less than the height of the surface of the first light extraction layer 18 far away from the display substrate 100 in the second direction Y, and such arrangement can also achieve refraction of total reflected light, improve the light extraction efficiency of the front side of the display panel, reduce the lateral light extraction efficiency of the display panel, and increase privacy protection effect. Such arrangement can reduce color crossover and improve display effect.

In an example embodiment, the first groove 181 is set as a via hole penetrating through the first light extraction layer 18. It should be avoided that the interface between the groove bottom wall of the first groove 181 and the second light extraction layer 19 forms a total reflection surface, which may affect the light extraction efficiency. Certainly, the first groove 181 may also be set as a blind hole.

The above-mentioned second light extraction layer 19 is arranged as a whole layer. In some other example embodiments of the present disclosure, the second light extraction layer 19 may be arranged as a plurality of divided islands. A second groove 191 is arranged in an island shaped second light extraction layer 19.

The specific structures and principles of the first light extraction layer 18 and the second light extraction layer 19 have been described above, and the positions of the first light extraction layer 18 and the second light extraction layer 19 will be described in detail below through several example embodiments.

Figure 8:
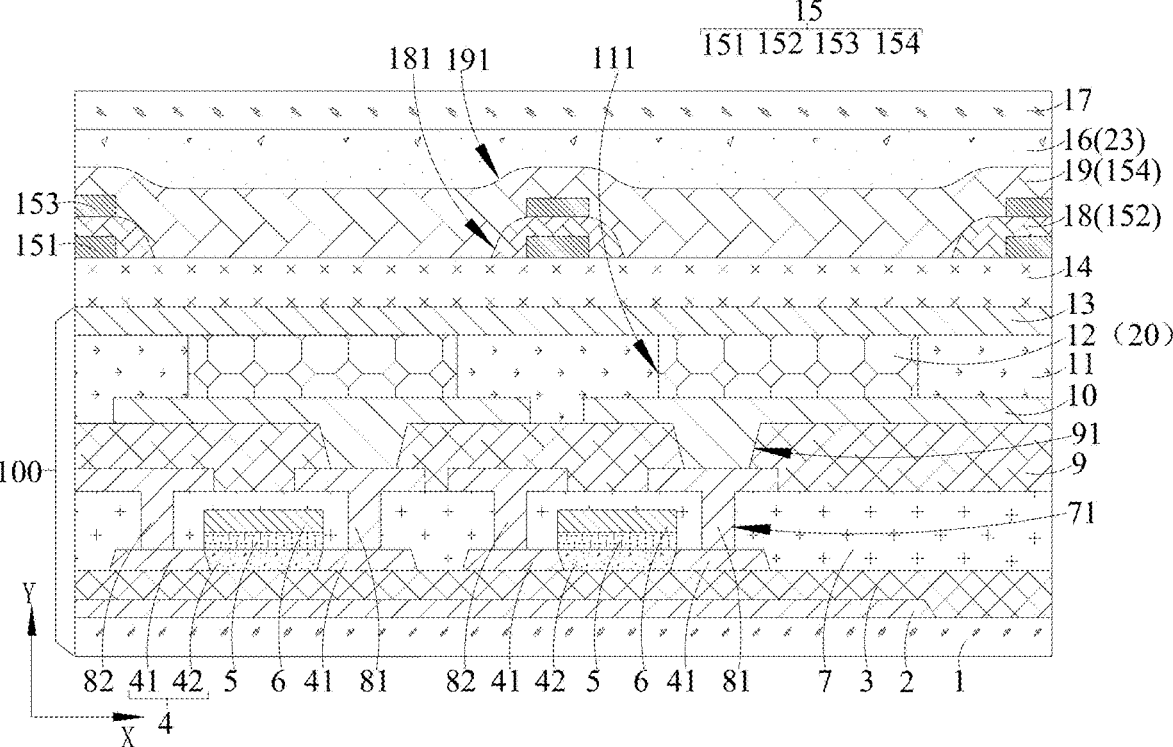
FIG. 8 is a schematic structural diagram of a display panel according to a fourth example embodiment of the present disclosure.

Please continue to refer to FIG. 8, an encapsulation layer group 14 is arranged on a side of the second electrode 13 away from the base substrate 1. The encapsulation layer group 14 may be set as multiple layers, and the encapsulation layer group 14 may include an organic layer and an inorganic layer, and the specific materials and number of layers will not be repeated here.

A touch layer group 15 is arranged on the light exit side of the display substrate 100. Specifically, the touch layer group 15 is arranged on a side of the encapsulation layer group 14 away from the display substrate 100. The touch layer group 15 may include a first touch metal layer 151, a touch insulating layer 152 and a second touch metal layer 153. The first touch metal layer 151 is arranged on the light exit side of the display substrate 100. Specifically, the first touch metal layer 151 is arranged on a side of the encapsulation layer group 14 away from the base substrate 1. The touch insulating layer 152 is arranged on a side of the first touch metal layer 151 away from the display substrate 100. The second touch metal layer 153 is arranged on a side of the touch insulating layer 152 away from the display substrate 100.

The material of the touch insulating layer 152 may be Over Coating (OC) adhesive, and the refractive index of the touch insulating layer 152 is greater than or equal to 1.4 and less than or equal to 1.5.

In this example embodiment, the touch insulating layer 152 may be reused as the first light extraction layer 18. That is, the touch insulating layer 152 can function to insulate and isolate the first touch metal layer 151 and the second touch metal layer 153, and can also play the role of the first light extraction layer 18 to perform total reflection of light; and this arrangement can reduce a mask process, improve efficiency and reduce costs.

Figure 9:
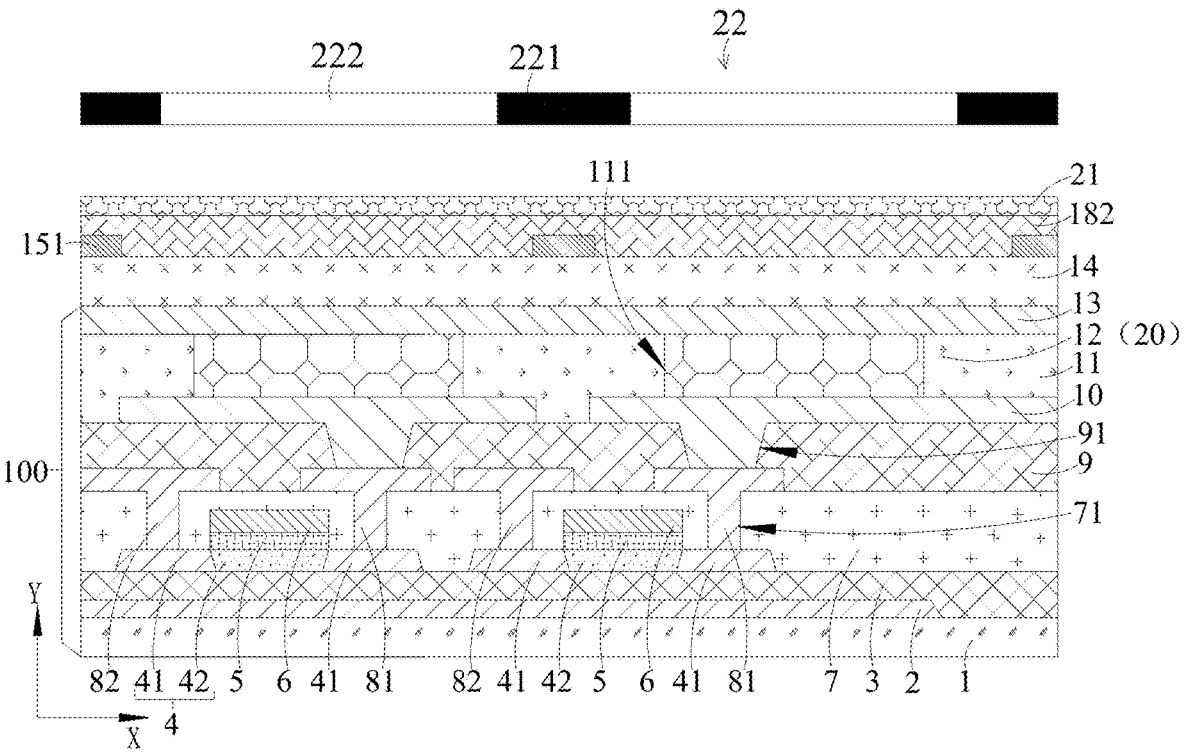
FIG. 9 to FIG. 12 are structural schematic diagrams for illustrating various steps in preparing the display panel in FIG. 8.

The preparation process of the first light extraction layer 18 is as follows. Referring to FIG. 9, a first light extraction material layer 182 is formed by chemical vapor deposition on a side of the first touch metal layer 151 away from the display substrate 100, and a photoresist 21 is applied on a side of the first light extraction material layer 182 away from the display substrate 100. A mask plate 22 is placed on a side of the photoresist 21 away from the display substrate 100. The mask plate 22 may include a light-shielding portion 221 and a light transmission portion 222. The light transmission portion 222 is arranged opposite to the sub-pixel 20, and the remaining portion is arranged as opposite to the light-shielding portion 221. Then, photoresist 21 is exposed to light, and finally the photoresist 21 is developed to remove the photoresist 21 arranged as opposite to the light transmission portion 222. As shown in FIG. 10, the remaining photoresist 21 is used as a mask layer, and the first light extraction material layer 182 is etched to remove the partially exposed first light extraction material layer 182 to form the first groove 181, and the first light extraction material layer 182 covered by the photoresist 21 forms the first light extraction layer 18. The thickness of the first light extraction layer 18 is greater than or equal to 2 micrometers and less than or equal to 3 micrometers.

It should be noted that the etching depth of the first groove 181 may be adjusted by the length of the etching time, that is, whether the first groove 181 is formed as a via hole penetrating through the first light extraction layer 18 or a blind hole may be determined by adjusting the length of the etching time. The longer the etching time is, the greater the depth of the first groove 181 will be.

Of course, the first light extraction layer 18 can also be formed by other methods, and the specific process will not be repeated here.

Figure 11:
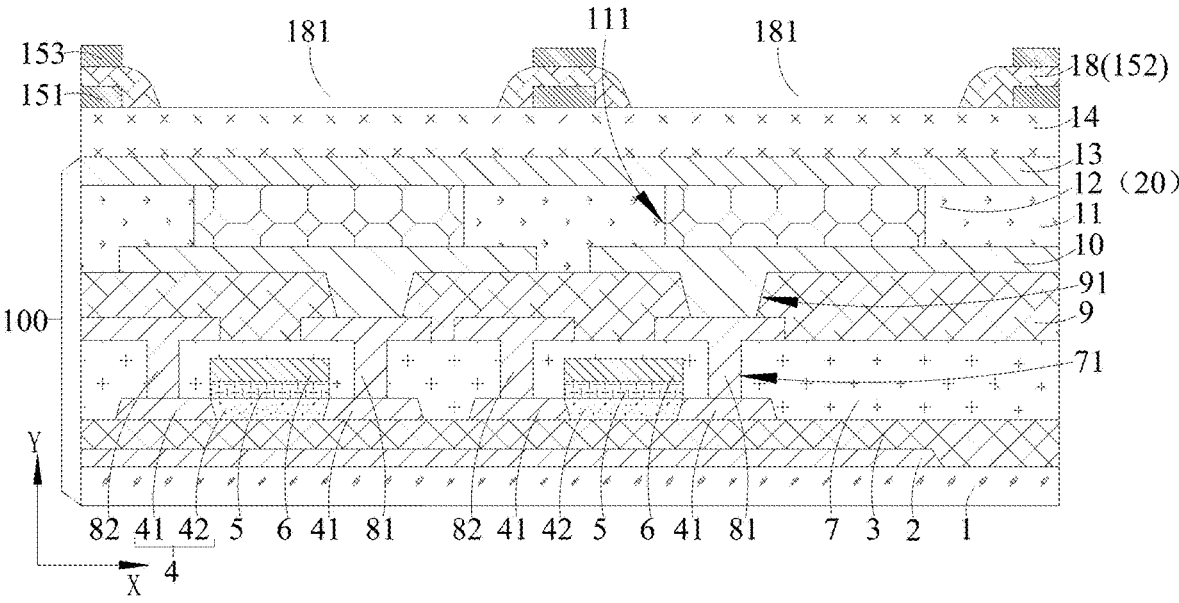

Referring to FIG. 11, the second touch metal layer 153 is formed on a side of the first light extraction layer 18 away from the base substrate 1.

In this example embodiment, the first touch metal layer 151 and the second touch metal layer 153 form a touch pattern, and the touch pattern may include a plurality of metal lines. The plurality of metal lines are connected to form a grid structure. Therefore, the orthographic projection of the touch pattern on the base substrate 1 is also a grid shape. A gap is arranged between two adjacent second grooves 191. The orthographic projection of each metal line on the display substrate 100 is located within the orthographic projection of a corresponding gap on the display substrate 100. The sub-pixels 20 are also located in the grids of the orthographic projection of the touch pattern on the base substrate 1, and there is a one-to-one correspondence between the sub-pixels 20 and the first grooves 181 and the second grooves 191. It should be avoided that the metal lines of the first touch metal layer 151 and the second touch metal layer 153 affect the light extraction efficiency.

In this example embodiment, as shown in FIG. 12, a protection layer 154 is formed on a side of the second touch metal layer 153 away from the base substrate 1 through processes such as coating and spin coating and so on. That is, the touch control layer group 15 may also include a protection layer 154, which is arranged on a side of the second touch metal layer 153 away from the display substrate 100. The protection layer 154 may be reused as the second light extraction layer 19. That is, the protection layer 154 can not only protect the second touch metal layer 153, but also play the role of the second light extraction 19 to refract light; and such arrangement can reduce one mask process, improve efficiency and reduce costs.

The thickness of the second light extraction layer 19 is greater than or equal to 3 micrometers and less than or equal to 6 micrometers. The thickness of the second light extraction layer 19 is relatively thin, which is beneficial to the bending of the display panel, thus making this technology applicable to flexible display panels.

The material of the protection layer 154 may be Over Coating (OC) adhesive, and the refractive index of the protection layer 154 is greater than or equal to 1.7 and less than or equal to 1.8.

It should be noted that although the protection layer 154 and the touch insulating layer 152 are made of the same material, the doped substance or the amount of the doped substance in the material may be adjusted to adjust the refractive index. Of course, in other example embodiments of the present disclosure, the protection layer 154 (the second light extraction layer 19) and the touch insulating layer 152 (the first light extraction layer 18) can be made of different materials, as long as the refractive index of protection layer 154 (the second light extraction layer 19) is greater than the refractive index of the touch insulating layer 152 (the first light extraction layer 18).

In this example embodiment, the display panel may further include an adhesive layer 16 and a cover plate 17. The adhesive layer 16 is arranged on a side of the second light extraction layer 19 away from the display substrate 100. The cover plate 17 is arranged on a side of the adhesive layer 16 away from the display substrate 100; that is, the adhesive layer 16 bonds the cover plate 17 to the touch layer group 15.

The material of the adhesive layer 16 may be Optically Clear Adhesive (OCA) (an optical adhesive). The refractive index of the OCA optical adhesive is less than the refractive index of the second light extraction layer 19. That is, the refractive index of the adhesive layer 16 is less than the refractive index of the second light extraction layer 19. The refractive index of the adhesive layer 16 is greater than or equal to 1.4 and less than or equal to 1.45. Referring to FIG. 3 and FIG. 5, when the refractive index of the adhesive layer 16 is lower than the refractive index of the second light extraction layer 19, the light totally reflected by the groove sidewall of the first groove 181 will be refracted at the groove sidewall of the second groove 191, so that the refracted light can be emitted substantially perpendicular to the display surface of the display substrate 100. The adhesive layer 16 cooperates with the second light extraction layer 19 to improve light extraction efficiency; therefore, the adhesive layer 16 may be reused as the third light extraction layer 23. The thickness of the adhesive layer 16 is greater than or equal to 50 micrometers and less than or equal to 150 micrometers.

Of course, in other example embodiments of the present disclosure, as shown in FIG. 6, the refractive index of the adhesive layer 16 may be greater than the refractive index of the second light extraction layer 19, and in this case, the interface between the adhesive layer 16 and the second light extraction layer 19 will not form a total reflection interface, and the light that is totally reflected by the groove sidewall of the first groove 181 will be refracted at the groove sidewall of the second groove 191, so that the refracted light can be emitted substantially perpendicular to the display surface of the display substrate 100.

In addition, it should be noted that, as shown in FIG. 6, since the extension length of the groove sidewall of the second groove 191 is relatively long, there is still a part of the light that does not experience the total reflection of the groove sidewall of the first groove 181 and is directly incident to the groove sidewall of the second groove 191 and refracted at the groove sidewall of the second groove 191. Because the refractive index of the second light extraction layer 19 is smaller than the refractive index of the third light extraction layer 23, the light is traveling from the optically rarer medium to the optically denser medium, and the angle of refraction is smaller than the angle of incidence, so that obliquely incident light is refracted to the front side of the display panel, thereby improving the light extraction efficiency of the front side of the display panel.

The formula $n1 \times \sin \alpha1 = n2 \times \sin \alpha2$ (where n1 is the refractive index of the incident side medium, $\alpha1$ is the angle of incidence of light, n2 is the refractive index of the refraction side medium, $\alpha2$ is the angle of refraction of light) to calculate the inclination angle of the second groove 191.

The adhesive layer 16 is formed on the side of the second light extraction layer 19 away from the display substrate 100 through processes such as coating and spin coating. The adhesive layer 16 has certain fluidity, so that the side of the adhesive layer 16 away from the display substrate 100 is plane, and thus the cover plate 17 and the adhesive layer 16 may be well bonded, to avoid air bubbles between the cover plate 17 and the adhesive layer 16 which will affect the light-emitting effect.

Of course, in some other example implementations of the present disclosure, other layer(s) may be arranged on the side of the second light extraction layer 19 away from the display substrate 100, as long as the above-mentioned refractive index requirement(s) can be met, and other layer(s) may be reused as the third light extraction layer 23.

It should be noted that the closer the distance between the first light extraction layer 18 and the sub-pixel 20 in the second direction, the better effect can be achieved. Since the angle of light emission is fixed, the farther away from the sub-pixel 20, the more scattered the light is, which is not conducive for more light to be totally reflected. The longer the extension length of groove sidewall of the second groove

191 is, the better effect can be achieved. This will not affect the light extraction at the front side, but can also make more light be refracted to the front side of the display panel, thereby improving the light extraction efficiency of the front side.

Figure 13:
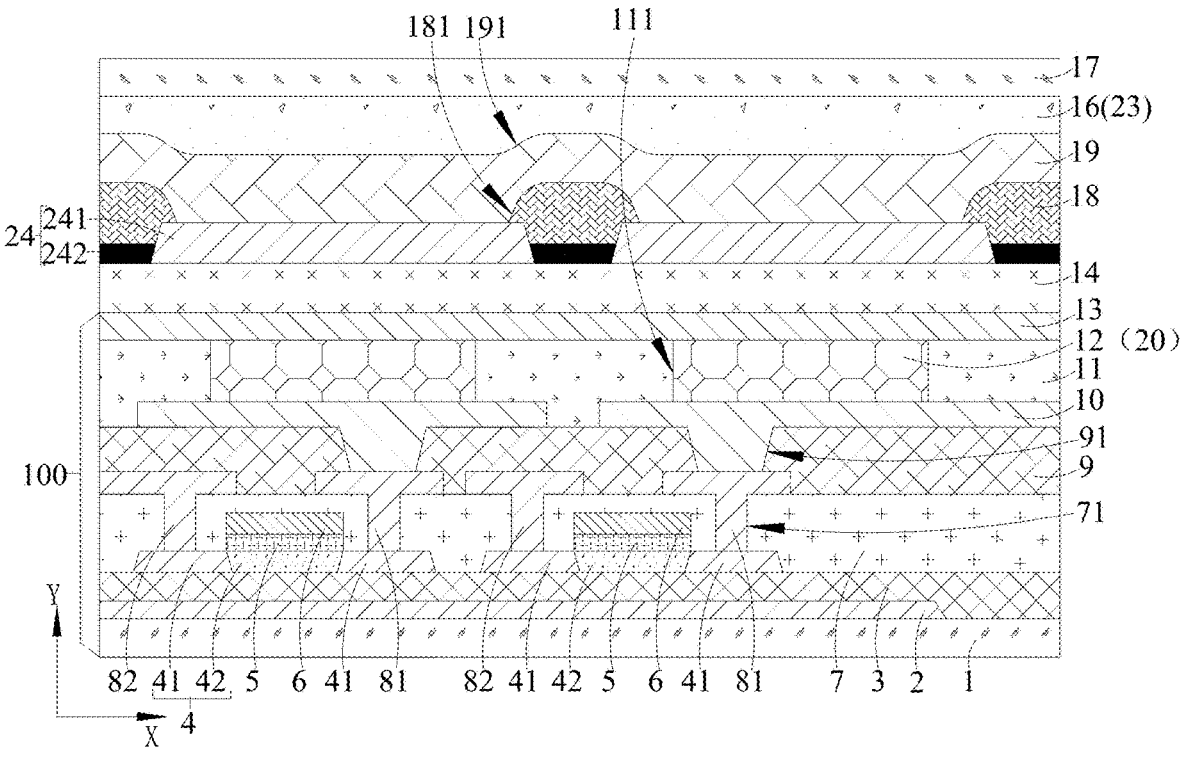
FIG. 13 is a schematic structural diagram of a display panel according to a fifth example embodiment of the present disclosure.

In addition, in some other example embodiments of the present disclosure, as shown in FIG. 13, the display panel may further include a color filter layer 24, which is arranged on a side of the encapsulation layer group 14 away from the display substrate 100. The color filter layer 24 includes a black matrix 242 and a filter portion 241. The filter portion 241 may include a red filter portion, a green filter portion and a blue filter portion. The red filter portion enables red light to pass through, the green filter portion enables green light to pass through, the blue filter portion enables blue light to pass through.

The height of the black matrix 242 in the second direction Y is smaller than the height of the filter portion 241 in the second direction Y. The first light extraction layer 18 is arranged on a side of the color filter layer 24 away from the display substrate 100. Specifically, the first light extraction layer 18 is arranged on a side of the black matrix 242 away from the display substrate 100. The second light extraction layer 19 is arranged on a side of the first light extraction layer 18 away from the color filter layer 24. Of course, the touch layer group 15 can also be arranged between the color filter layer 24 and the encapsulation layer group 14, and its specific structure will not be repeated here.

Figure 14:
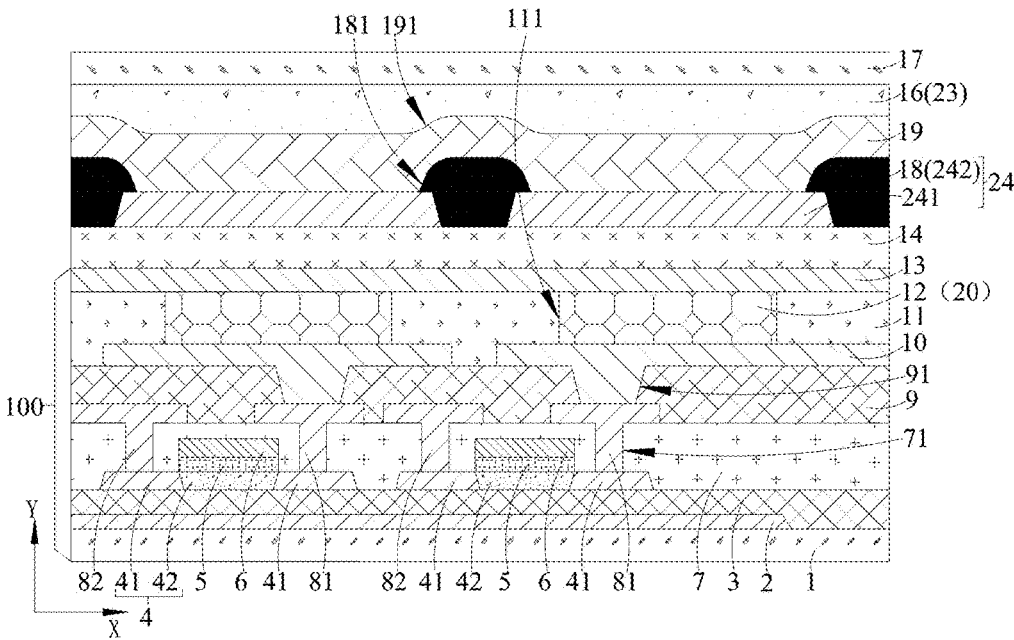
FIG. 14 is a schematic structural diagram of a display panel according to a sixth example embodiment of the present disclosure.

Referring to FIG. 14, in some other example embodiments of the present disclosure, the edge portion of the black matrix 242 covers the edge portion of the filter portion 241. Such structure can be achieved by first preparing the filter portion 241 and then forming the black matrix 242. The height of the black matrix 242 in the second direction Y is greater than the height of the filter portion 241 in the second direction Y, and the black matrix 242 is reused as the first light extraction layer 18. Specifically, a part of the black matrix 242 which protrudes to the filter portion 241 is reused as the first light extraction layer 18. By such arrangement, one step of masking process can be reduced, the efficiency can be improved, and the cost can be reduced. The second light extraction layer 19 is formed on the side of the color filter layer 24 away from the display substrate 100. The refractive index of the second light extraction layer 19 is greater than the refractive index of the black matrix 242, which can also improve the front light extraction efficiency of the display panel.

Figure 15:
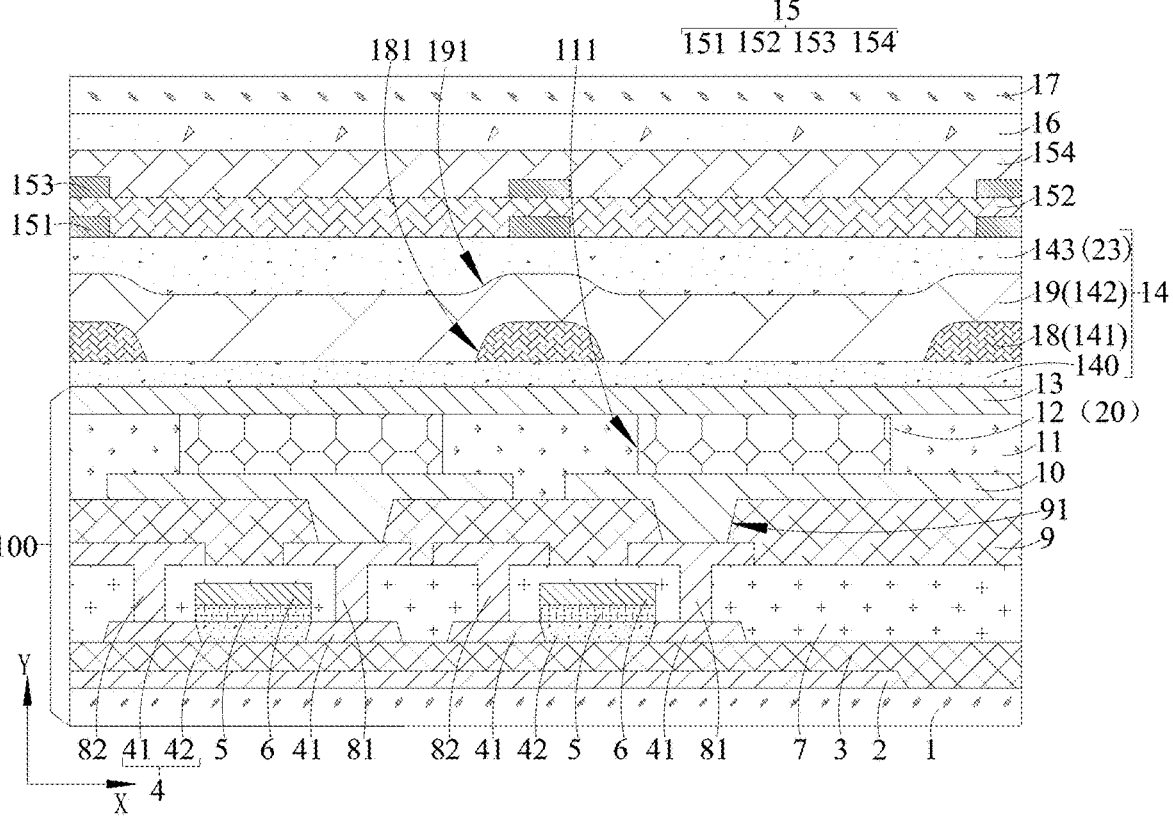
FIG. 15 is a schematic structural diagram of a display panel according to a sixth example embodiment of the present disclosure.

Referring to FIG. 15, in some other example embodiments of the present disclosure, the encapsulation layer group 14 may include an encapsulation base layer 140, a first encapsulation layer 141, a second encapsulation layer 142 and a third encapsulation layer 143.

The encapsulation base layer 140 is arranged on the light exit side of the display substrate 100. The material of the encapsulation base layer 140 may be silicon nitride (SiNx), silicon oxide (SiOx) and the like.

The first encapsulation layer 141 is arranged on a side of the encapsulation base layer 140 away from the display substrate 100. The material of the first encapsulation layer 141 may be silicon oxide (SiOx) or silicon oxynitride (SiNO) or the like. The first encapsulation layer 141 is formed on the side of the first planarization layer away from the display substrate 100 by Chemical Vapor Deposition (CVD).

In this example embodiment, the first groove 181 is arranged in the first encapsulation layer 141, and the first encapsulation layer 141 may be reused as the first light extraction layer 18. That is, the first encapsulation layer 141 can not only serve an encapsulation function for the display substrate 100, and can also play the role of the first light extraction layer 18 to perform total reflection of light; this embodiment can reduce one mask process, improve efficiency and reduce cost.

The second encapsulation layer 142 is arranged on a side of the first encapsulation layer 141 away from the display substrate 100. The material of the second encapsulation layer 142 may be organic materials such as acrylic, epoxy, etc., and the refractive index of the second encapsulation layer 142 is higher than that of the first encapsulation layer 142. The refractive index may be increased by doping metal nanoparticles in the second encapsulation layer 142 formed by organic material. The second encapsulation layer 142 may be formed on the side of the first encapsulation layer 141 away from the display substrate 100 by Ink-jet printing (IJP).

In this example embodiment, second grooves are arranged in the second encapsulation layer 142. The second encapsulation layer 142 may be reused as the second light extraction layer 19. That is, the second encapsulation layer 142 can not only serve an encapsulation function for the display substrate 100, but can also play the role of the second light extraction layer 19 to refract light; moreover, this embodiment can reduce one mask process, improve efficiency and reduce cost.

Because the refractive index of the second light extraction layer 19 is greater than the refractive index of the first light extraction layer 18, light in the first groove 181 from the second light extraction layer 19 to the first light extraction layer 18 is from the optically denser medium into the optically rarer medium, the angle of incidence is greater than a certain critical angle (light is away from the normal) of the incident light, the refracted light will disappear, the incident light will be reflected and not travel into the first light extraction layer 18, and a total reflection occurs. Thus, the inclined light is emitted from the front of the display panel, thereby improving the light extraction efficiency of the display panel.

The third encapsulation layer 143 is arranged on a side of the second encapsulation layer 142 away from the display substrate 100. The material of the third encapsulation layer 143 may be silicon nitride (SiNx) or silicon oxynitride (SiNO), etc. . . . The refractive index of the third encapsulation layer 143 is greater than or equal to 1.70 and less than or equal to 1.85. The third encapsulation layer 143 is formed on the side of the second encapsulation layer 142 away from the display substrate 100 by Chemical Vapor Deposition (CVD), and a part of the third encapsulation layer 143 is formed in the second grooves 191.

Since the refractive index of the third encapsulation layer 143 is greater than that of the second encapsulation layer 142, the travel of light from the second encapsulation layer 142 to the third encapsulation layer 143 is a travel from an optically rarer medium into an optically denser medium, and no total reflection occurs. The light totally reflected by the groove sidewall of the first groove 181 will be refracted by the groove sidewall of the second groove 191, so that the refracted light can exit substantially perpendicular to the display surface of the display substrate 100. The third encapsulation layer 143 may be reused as the third light extraction layer 23.

On the side of the third encapsulation layer 143 away from the display substrate 100, the first touch metal layer 151, the touch insulating layer 152, the second touch metal layer 153, the protection layer 154, the adhesive layer and the cover plate 17 are sequentially stacked. The specific structures of them have been described in detail above, and thus will not be repeated here.

Of course, in some other example implementations of the present disclosure, the first light extraction layer 18 and the second light extraction layer 19 may be set independently, and their specific positions may be set between the touch layer group and the encapsulation layer group, or may be arranged on the side of the touch layer group away from the display substrate, etc.; they can also be arranged at other positions, which will not be repeated here.

Based on the same inventive concept, example embodiments of the present disclosure provide a display device, which may include any one of the display panels described above. The specific structures of the display panel have been described in detail above, so it will not be repeated here.

The specific type of the display device is not particularly limited, and any type of display device commonly used in the art may be used, for example mobile device such as mobile phone, wearable device such as watch, VR device, etc., and those skilled in the art can choose accordingly according to the specific use of the display device, which will not be described in detail here.

It should be noted that in addition to the display panel, the display device may also include other necessary components and members. Taking a display as an example, the display may further include for example a casing, a circuit board, a power cord, etc., and those skilled in the art can know supplemental components according to specific use of the display device, which will not be described in detail here.

Compared with the related art, the beneficial effects of the display device provided by the example embodiments of the present disclosure are the same as that of the display panel provided by the above example embodiments, and will not be repeated here.

Other embodiments of the present disclosure will be readily apparent to those skilled in the art from consideration and practice of the invention disclosed herein. The present disclosure is intended to cover any modification, use or adaptation of the present disclosure, and such modification, use or adaptation follow the general principles of the present disclosure and include common knowledge or conventional technical means in the technical field not disclosed in the present disclosure. The specification and examples are to be considered exemplary only, and the true scope and spirit of the present disclosure should be defined by the appended claims.

What is claimed is:

1. A display panel, comprising:

a display substrate comprising a plurality of sub-pixels;

a first light extraction layer arranged on a light exit side of the display substrate, wherein the first light extraction layer comprises a plurality of first grooves, and an orthographic projection of each of the first grooves on the display substrate covers a corresponding sub-pixel; and a second light extraction layer arranged on a side of the first light extraction layer away from the display substrate and at least partially arranged in the first grooves, wherein a refractive index of the second light extraction layer is greater than a refractive index of the first light extraction layer, the second light extraction layer comprises a plurality of second grooves, and an orthographic projection of each of the second grooves on the display substrate covers a corresponding sub-pixel:

wherein a height of a groove sidewall of each of the first grooves in a second direction increases as a distance from a center of the corresponding sub-pixel in a first direction increases, a height of a groove sidewall of each of the second grooves in the second direction increases as a distance from the center of the corresponding sub-pixel in the first direction increases, the second direction is perpendicular to a display surface of the display substrate, and the first direction is parallel to the display surface of the display substrate;

wherein the groove sidewall of each of the first grooves comprises a curved surface, the groove sidewall of each of the second grooves comprises a curved surface, and a radius of curvature of the groove sidewall of each of the first grooves is smaller than a radius of curvature of the groove sidewall of each of the second grooves;

wherein:

the groove sidewall of each of the first grooves comprises a first portion and a second portion that are smoothly connected in sequence, the first portion is closer to the display substrate than the second portion, the first portion is set as a slope, and the second portion is set as an arc surface; and the groove sidewall of each of the second groove comprises a third portion, a fourth portion and a fifth portion that are smoothly connected in sequence, the third portion is closer to the display substrate than the fifth portion, the fourth portion is set as a slope, and the third portion and the fifth portion are set as arc surfaces;

wherein an inclination angle of the first portion is greater than an inclination angle of the fourth portion.

2. The display panel according to claim 1, wherein an orthographic projection of the groove sidewall of each of the first grooves on the display substrate is located within an orthographic projection of a groove sidewall of a corresponding one of the second grooves on the display substrate.

3. The display panel according to claim 2, wherein a groove bottom wall of each of the first grooves is a flat surface, a groove bottom wall of each of the second grooves is a flat surface, an orthographic projection of the groove bottom wall of each of the second grooves on the display substrate covers a corresponding sub-pixel, and the orthographic projection of the groove bottom wall of each of the second grooves on the display substrate is located within an orthographic projection of the groove bottom wall of a corresponding one of the first grooves on the display substrate.

4. The display panel according to claim 1, wherein the orthographic projection of each of the second grooves on the display substrate is located within an orthographic projection of a corresponding one of the first grooves on the display substrate;

wherein a groove bottom wall of each of the first grooves is a flat surface, a groove bottom wall of each of the second grooves is a flat surface, an orthographic projection of the groove bottom wall of each of the second grooves on the display substrate covers a corresponding sub-pixel, and the orthographic projection of each of the second grooves on the display substrate is located within an orthographic projection of the groove bottom wall of a corresponding one of the first grooves on the display substrate.

5. The display panel according to claim 1, wherein a depth of each of the first grooves is greater than a depth of each of the second grooves;

wherein a distance between a plane where a groove bottom wall of each of the second grooves is located and the display substrate is greater than a distance between the display substrate and a surface of the first light extraction layer away from the display substrate.

6. The display panel according to claim 1, wherein each of the first grooves is set as a via hole penetrating the first light extraction layer.

7. The display panel according to claim 1, further comprising:

an encapsulation layer group arranged on the light exit side of the display substrate;

wherein the display panel further comprises:

a touch layer group arranged on a side of the encapsulation layer group away from the display substrate;

wherein the touch layer group comprises:

a first touch metal layer arranged on the light exit side of the display substrate;

a touch insulating layer arranged on a side of the first touch metal layer away from the display substrate, wherein the touch insulating layer is reused as the first light extraction layer; and a second touch metal layer arranged on a side of the touch insulating layer away from the display substrate;

wherein the touch layer group further comprises:

a protection layer arranged on a side of the second touch metal layer away from the display substrate, wherein the protection layer is reused as the second light extraction layer.

8. The display panel according to claim 7, wherein the first touch metal layer and the second touch metal layer form a touch pattern, and the touch pattern comprises a plurality of metal lines, a gap is provided between two adjacent second grooves, and an orthographic projection of each of the metal lines on the display substrate is located within an orthographic projection of a corresponding gap on the display substrate.

9. The display panel according to claim 7, further comprising:

a color filter layer arranged on a side of the encapsulation layer group away from the display substrate, wherein the color filter layer comprises a black matrix and a filter portion.

10. The display panel according to claim 9, wherein an edge portion of the black matrix covers an edge portion of the filter portion, and a height of the black matrix in the second direction is greater than a height of the filter portion in the second direction, and the black matrix is reused as the first light extraction layer.

11. The display panel according to claim 9, wherein a height of the black matrix in the second direction is smaller than a height of the filter portion in the second direction, and the first light extraction layer is arranged on a side of the color filter layer away from the display substrate.

12. The display panel according to claim 7, wherein the encapsulation layer group comprises:

an encapsulation base layer arranged on the light exit side of the display substrate;

a first encapsulation layer arranged on a side of the encapsulation base layer away from the display substrate;

a second encapsulation layer arranged on a side of the first encapsulation layer away from the display substrate; and a third encapsulation layer arranged on a side of the second encapsulation layer away from the display substrate;

wherein the first light extraction layer is a layer in the encapsulation layer group, and the second light extraction layer is a layer in the encapsulation layer group.

13. The display panel according to claim 12, wherein the first encapsulation layer is reused as the first light extraction layer, the second encapsulation layer is reused as the second light extraction layer, and a part of the third encapsulation layer is arranged in the second grooves.

14. The display panel according to claim 1, further comprises:

a third light extraction layer arranged on a side of the second light extraction layer away from the display substrate and partially arranged in the second grooves, wherein a refractive index of the third light extraction layer is larger than or smaller than the refractive index of the second light extraction layer.

15. The display panel according to claim 14, further comprising:

an adhesive layer arranged on the light exit side of the display substrate; and a cover plate arranged on a side of the adhesive layer away from the display substrate.

16. The display panel according to claim 15, wherein the adhesive layer is arranged on the side of the second light extraction layer away from the display substrate, and the adhesive layer is reused as the third light extraction layer.

17. A display device, comprising a display panel, wherein the display panel comprises:

a display substrate comprising a plurality of sub-pixels;

a first light extraction layer arranged on a light exit side of the display substrate, wherein the first light extraction layer comprises a plurality of first grooves, and an orthographic projection of each of the first grooves on the display substrate covers a corresponding sub-pixel; and a second light extraction layer arranged on a side of the first light extraction layer away from the display substrate and at least partially arranged in the first grooves, wherein a refractive index of the second light extraction layer is greater than a refractive index of the first light extraction layer, the second light extraction layer comprises a plurality of second grooves, and an orthographic projection of each of the second grooves on the display substrate covers a corresponding sub-pixel;

wherein a height of a groove sidewall of each of the first grooves in a second direction increases as a distance from a center of the corresponding sub-pixel in a first direction increases, a height of a groove sidewall of each of the second grooves in the second direction increases as a distance from the center of the corresponding sub-pixel in the first direction increases, the second direction is perpendicular to a display surface of the display substrate, and the first direction is parallel to the display surface of the display substrate;

wherein the groove sidewall of each of the first grooves comprises a curved surface, the groove sidewall of each of the second grooves comprises a curved surface, and a radius of curvature of the groove sidewall of each of the first grooves is smaller than a radius of curvature of the groove sidewall of each of the second grooves;

wherein:

the groove sidewall of each of the first grooves comprises a first portion and a second portion that are smoothly connected in sequence, the first portion is closer to the display substrate than the second portion, the first portion is set as a slope, and the second portion is set as an arc surface; and the groove sidewall of each of the second groove comprises a third portion, a fourth portion and a fifth portion that are smoothly connected in sequence, the third portion is closer to the display substrate than the fifth portion, the fourth portion is set as a slope, and the third portion and the fifth portion are set as are surfaces; wherein an inclination angle of the first portion is greater than an inclination angle of the fourth portion.

* * * * *